(12) United States Patent
Steinberg et al.

(10) Patent No.: US 6,367,052 B1
(45) Date of Patent: Apr. 2, 2002

(54) METHOD OF PRODUCING OPTIMIZED DESIGNS USING COMPUTER SYSTEMS AND DESIGNS PRODUCED THEREFROM

(75) Inventors: Louis I. Steinberg, Highland Park; J. Storrs Hall, Flemington; Brian D. Davison, North Plainfield, all of NJ (US)

(73) Assignee: Rutgers, The State University of New Jersey

( * ) Notice: Subject to any disclaimer, the term of this patent is extended or adjusted under 35 U.S.C. 154(b) by 0 days.

(21) Appl. No.: 09/214,986
(22) PCT Filed: Jul. 17, 1997
(86) PCT No.: PCT/US97/12489
  § 371 Date: Jun. 7, 1999
  § 102(e) Date: Jun. 7, 1999
(87) PCT Pub. No.: WO98/02833
  PCT Pub. Date: Jan. 22, 1998

Related U.S. Application Data
(60) Provisional application No. 60/021,907, filed on Jul. 17, 1996.

(51) Int. Cl.[7] .......................... G06F 17/50; G06F 17/00; G06F 19/00
(52) U.S. Cl. .......................................................... 716/2
(58) Field of Search ............................... 703/22; 716/2; 700/99

(56) References Cited

U.S. PATENT DOCUMENTS

| | | | |
|---|---|---|---|
| 5,177,685 A | 1/1993 | Davis et al. | |
| 5,416,892 A | 5/1995 | Loken-Kim | |
| 5,467,268 A | * 11/1995 | Sisley et al. | ................ 364/401 |
| 5,541,849 A | 7/1996 | Rostoker et al. | |
| 5,555,201 A | 9/1996 | Dangelo et al. | |
| 5,598,344 A | 1/1997 | Dangelo et al. | |

\* cited by examiner

Primary Examiner—Matthew Smith
Assistant Examiner—A. M. Thompson
(74) Attorney, Agent, or Firm—Hoffmann & Baron, LLP

(57) ABSTRACT

A method and program is used to produce optimized designs using computer systems by controlling the operation of a hierarchy or sequence of applications of design optimization programs, design quality estimation programs, and value computation programs.

7 Claims, 4 Drawing Sheets

METHOD OF PRODUCING OPTIMIZED DESIGNS USING COMPUTER SYSTEMS AND DESIGNS PRODUCED THEREFROM

RELATED APPLICATIONS

This application is a conversion of and claims priority to provisional patent application No. 60/021,907 filed Jul. 17, 1996, which is herein incorporated by reference.

This work was performed under ARPA Grant No. DABT-63-93-C-0064.

FIELD OF THE INVENTION

The present invention relates to methods of producing optimized designs using a computer system by controlling the operation of a hierarchy or sequence of applications of design optimization programs, design quality estimation programs and value computation programs. In particular these methods can be used to produce designs useful for developing machinery, articles of manufacture, compositions of matter, thereof.

BACKGROUND OF THE INVENTION

An important characteristic of stochastic optimization methods, such as simulated annealing, genetic algorithms and multi-start hill climbing, is that they can be run again and again on the same inputs, each time potentially producing a different answer. Some of the answers will be better, some worse. Indeed, it is common to run such algorithms a few times, and to use the best of the answers produced. The difficulty is in determining how many times.

The issue is complicated by the fact that in many cases the output of the optimizer is not a final artifact. Rather, the design task at hand is being done in a series of stages, or levels of abstraction, and the output of one optimizer is in turn used as input to another stage of design. For example, in designing a microprocessor, we might start with an instruction set, implement that as a set of register transfers, implement the register transfers as boolean logic, implement the boolean logic as a "net list" defining how specific circuit modules are to be wired together, implement the net list by choosing specific locations for the circuit modules and wires on the surface of a VLSI chip, etc. Thus, if several consecutive levels of design are to be done by stochastic methods, we really have a tree of alternate designs, whose leaves are the final, concrete designs, and whose internal nodes are designs at intermediate levels.

Each time an optimizer at any level gives us an output, the skilled artisan faces a choice of what to do next. The question is whether one should declare the best design one has so far at this level to be "good enough" and proceed to use it as input to the next level, or whether one should rerun the optimizer in hopes of getting a better design at the current level, or whether one should go back up to some higher level in the tree and try again there.

Current practice is often to use a "waterfall" approach, i.e. run the optimizer at one level some number of times, choose the best result, and proceed forwards. This would be an optimal approach if one had a completely accurate way of evaluating designs at intermediate levels (i.e., evaluating how good a final design one will get from this intermediate design), but in practice all one normally has are heuristics that tell us approximately how good an intermediate design is. In order to tell, e.g., which of two intermediate designs is actually better, we may have to try generating one or more designs at the next level from each of them.

The present invention presents an alternative to the waterfall method, which we call "rational best first" (RBF) search, that is capable of doing this kind of exploratory design. We will describe RBF and present empirical data from one example design task showing that RBF can be a large improvement over waterfall search.

The key insight behind RBF is that a good control method is not one that finds the best design (since finding the absolute best design takes exponential time), but one that gives the best tradeoff between computation cost and design quality, and that therefore control decisions should be based on an analysis of the utility and the cost of each possible action.

SUMMARY OF THE INVENTION

In order to define the value, i.e. the utility, of running an optimizer, we have to define the value of the designs it produces. We will assume that we are given the values of the ground level objects, in the form of a function that maps an object's score into its value. We define the value of an intermediate level design to be the profit we will get from using that design as a starting point—i.e., the expected value of the final ground level design it will lead to, minus the expected cost of the computation needed to go from that intermediate level design to the final design.

Using this definition of value allows us to compare two designs that are at different levels of abstraction, and leads to a simple heuristic: always work on the design with the highest estimated profit, at whatever level it is on. Of course, to make this operational we need a way to estimate the profit inherent in an intermediate-level design, but it turns out that we can use the ground level values and some fairly simple statistical reasoning to do so.

One embodiment of the invention includes: A method for controlling a hierarchy or sequence of applications of design optimization programs, design quality estimation programs and value computation programs, in a computer system to improve the tradeoff between quality of a final design result and computation time expended in the optimization programs to get that result, each design optimization program in the sequence taking as input the previous design program's result; a first design optimization program taking as input one or more specifications of an overall design task and a last program producing as output a complete design result for said task; said method including the steps of:

1. inputting said one or more specifications of said overall design task and initializing a set of design objects to include at least said one or more specifications;
2. computing the initial estimate of the utility of designing from said specifications using said design optimization programs, said utility being defined as the average value of the final result of a design process starting with said specification, minus the average cost in computer time of said design process; wherein each of said optimization programs when run multiple times will produce different intermediate design results of varying quality as measured by said design quality estimation programs, and each of said optimization programs having a known or estimated cost in computer time per run, said value computation program taking as data the design quality of the overall design result of the overall design task as measured by the design quality estimation programs, and producing as output a value to the user of said overall design result in comparable units to the known or estimated costs of running said optimization programs;

3. choosing as a current design object from the set of design objects, the design object whose estimated utility is greatest; examining and recognizing if said current design object is a complete design result for the overall design task, and if so producing an output of said current design object as the final design result of the overall design task, and if not proceeding to step 4;

4. Running the appropriate optimization program with said current design object as input to produce a new design object as a result, running an appropriate design quality estimation program on said new design object, estimating the utility as defined above of said new design object, and adding said new design object to said set of design objects;

5. Revising the estimate of utility for the current design object based on the quality of the new design object, and revising the utility estimates of all ancestor design objects from which the current design object was derived, based on the revised utility estimate of the current design object; and repeating from step 3.

In another embodiment of the invention, the method includes computation of the utility of a new design object that is a complete design result for the overall design task by running the value computation program on the new design object.

In another embodiment of the invention the method includes applying a specific algorithm when computing the utility of the new design object that is not a complete design result for the overall design task. The conditions and algorithms applied in such an instance are:

Compute the threshold score, $s_t^n(s_p)$, for generating children objects at level n from a parent object at level n+1 whose score is $s_p$, to be such that $$\sum_{s<s_t^n(s_p)} (V^n(s) - V^n(s_t^n(s_p)))CSDP^{n+1}(s_p, s_c) = c^n$$

Whereby n is the level of the new design object, where levels are numbered so that level 0 includes the complete design results for the overall design task, and objects at level n are generated from objects at level n+1; whereby s ranges over possible scores of level n objects; whereby $CSDP^{n+1}(S_p, S_c)$ is an estimate of the probability that a design object generated from a design object at level n+1 will have score $S_c$, given that the object at level n+1 had score $S_p$; whereby $c^n$ is the cost of running the design optimization program that generates designs at level n, whereby $V^n(s)$ is the utility of a design at level n whose score is s; and compute the utility of the new design object at level n+1 according to the formula $V^{n+1}(s_p) = V^n(s_t^n(s_p))$.

A further embodiment of the invention includes a step of estimating the utility of design objects based on initially estimating the probability distribution of scores of the children of said design object from the score of said design object, and revising said estimate of the probability distribution of scores of the children of said design object based on the scores of such children as are actually generated. The estimates of the probability distribution of scores of the children of a design object are made according to the following formulas:

$$RD_{parent}^{n+1}(R) = \frac{RDS_{s_p}^{n+1}(R) \prod_{i=1...n} CSDR_R^{n+1}(s_i)}{\int RDS_{s_p}^{n+1}(R) \prod_{i=1...n} CSDR_R^{n+1}(s_i) dR}$$

whereby the child score distributions of the various design objects at any given level are approximated by a parameterized family of distributions $CSDR_R(s)$; whereby R is the parameter or list of parameters characterizing a specific distribution from said family of distributions and $CSDR_R(s) = P(\text{child score}=s)$ is the specific distribution of child scores, given R; whereby $RDS_{sp}^{n+1}(R)$ is a function giving an initial estimate of the probability that R is the correct value of the parameter characterizing the child score distribution of a level n+1 design object, based on the score $s_p$ of said level n+1 object; whereby the scores $s_i$, i=1 to n, are the scores of the children that have actually been generated; and whereby $RD_{parent}n+1(R)$ is the revised estimate of the probability that R is the correct value of the parameter characterizing the child score distribution of a parent design object at level n+1 based on both the score $s_p$ of said level n+1 design object and the scores $s_i$, $$CSD_{parent}^{n+1}(s) = \int_R RD_{parent}^{n+1}(R) CSDR_R^{n+1}(s) dR$$

whereby $CSD_{parent}^{n+1}(s)$ is the child score distribution of said level n+1 design object.

In a further embodiment of the invention there is included a computer generated design for a machine, an article of manufacture or a composition of matter, said design made by a process which controls a hierarchy or sequence of design optimization programs, design quality estimation programs and value computation programs, said process including the steps of:

1. inputing said one or more specifications of said overall design task and initializing a set of design objects to include at least said one or more specifications;

2. computing the initial estimate of the utility of designing from said specifications using said design optimization programs, said utility being defined as the average value of the final result of a design process starting with said specification, minus the average cost in computer time of said design process; wherein each of said optimization programs when run multiple times will produce different intermediate design results of varying quality as measured by said design quality estimation programs, and each of said optimization programs having a known or estimated cost in computer time per run, said value computation program taking as data the design quality of the overall design result of the overall design task as measured by the design quality estimation programs, and producing as output a value to the user of said overall design result in comparable units to the known or estimated costs of running said optimization programs;

3. choosing as a current design object from the set of design objects, the design object whose estimated utility is greatest; examining and recognizing if said current design object is a complete design result for the overall design task, and if so producing an output of said current design object as the final design result of the overall design task, and if not proceeding to step 4;

4. Running the appropriate optimization program with said current design object as input to produce a new design object as a result, running an appropriate design quality estimation program on said new design object, estimating the utility as defined above of said new design object, and adding said new design object to said set of design objects;

5. Revising the estimate of utility for the current design object based on the quality of the new design object, and revising the utility estimates of all ancestor design objects from which the current design object was derived, based on the revised utility estimate of the current design object; and repeating from step 3.

DETAILED DESCRIPTION AND EXAMPLES

By way of explanation of how the methodologies claimed herein operate, the following illustrative examples are provided. This example relates to the determination of the best design for positioning rectangular circuit modules on the surface of a VLSI chip.

The input to the placement problem is a set of modules, where each module is a rectangle of fixed size along with a set of "ports". A port is simply a location within the rectangle that a wire must connect to to connect this module to others.

Figure 1:
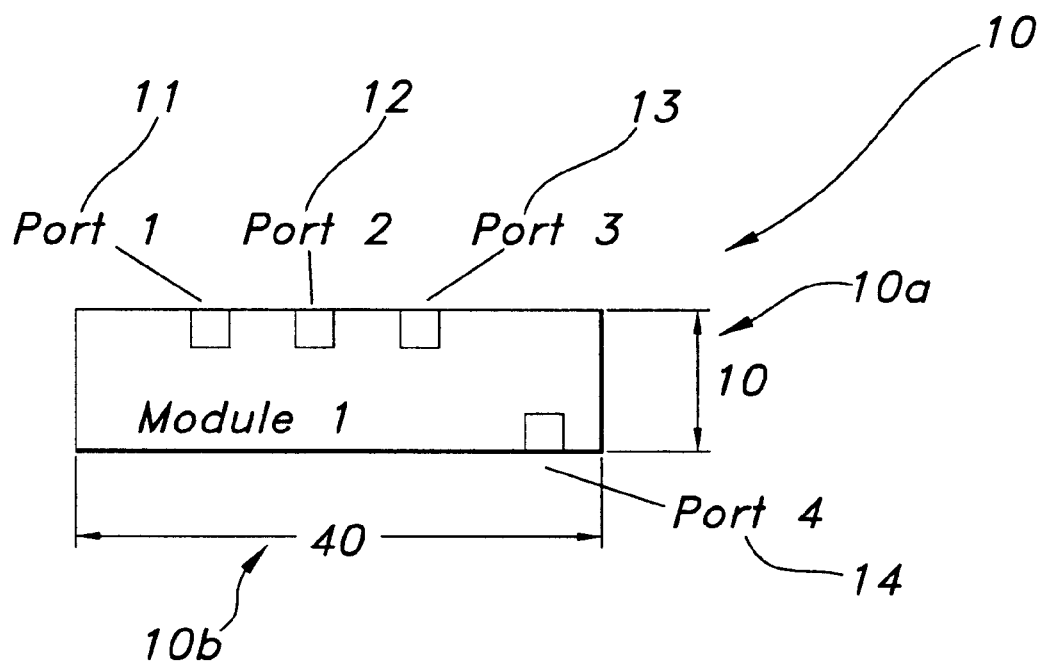
FIG. 1 shows an example of a specification of an overall design task for placing circuit modules on a VLSI chip.

In addition to the modules, the input includes a "netlist". A "net" is simply a set of ports on some number of modules; the meaning of a net is that these ports need to be wired together. A "netlist" is simply a list of nets, specifying how the whole circuit is to be wired. FIG. 1 is a typical layout of a module in prior art. Module 1 in FIG. 1 is a rectangle 10 of typical size 10×40, wherein the width 10a of the rectangle 10, is 10 inches and the length 10b of the rectangle 10, is 40 inches. Modules comprise of rectangles of various sizes. Moreover, module 1 includes a set of four ports, port 1 shown as element 11, port 2 as element 12, port 3 as element 13 and port 4 as element 14, respectively. Even though module 1 in FIG. 1 comprises of four ports, the number of ports in a module may vary depending on the size of the module.

Figure 2:
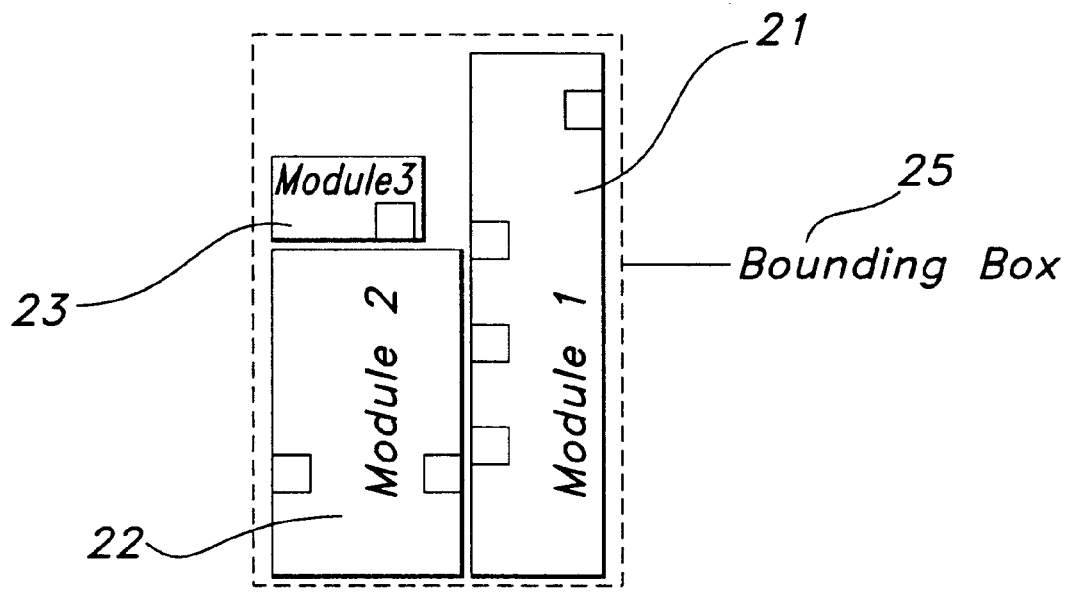
FIG. 2 shows an example of an overall result for the example design task of placing circuit modules on a VLSI chip using the present method.

The output from a placement problem is a location and orientation for each module. Modules may be rotated by any multiple of 90 degrees as reflected by module 1, element 21, module 2, element 22 and module 3 as element 23, respectively in FIG. 2. Rectangles may not overlap. The dashed line drawn around the modules is called the bounding box, element 25 as illustrated in FIG. 2. The rectangular bounding box, 25, portrays the amount of area/space taken up in the placement of the modules.

The quality of a placement is determined by two factors. One is the amount of wasted space in the placement, i.e., the area of a rectangular bounding box drawn around all the modules minus the total area of the modules themselves. The other factor is the estimated area taken by wires. Wire area is a the total estimated length of wire needed to connect the ports as specified by the netlist times a constant representing the wire width. Wire length for a single net is estimated as half the perimeter of a rectangular bounding box around the ports the net connects, and wire length for the entire netlist is the sum of the lengths for the nets. Note that the wire length is itself only a heuristic estimate, but for the purpose of this work we take it as our ground-level evaluation. The final "score" of a placement is a weighted sum of the wasted area and the wire area. The lower the score, the better the design.

Figures 3A, 3B:
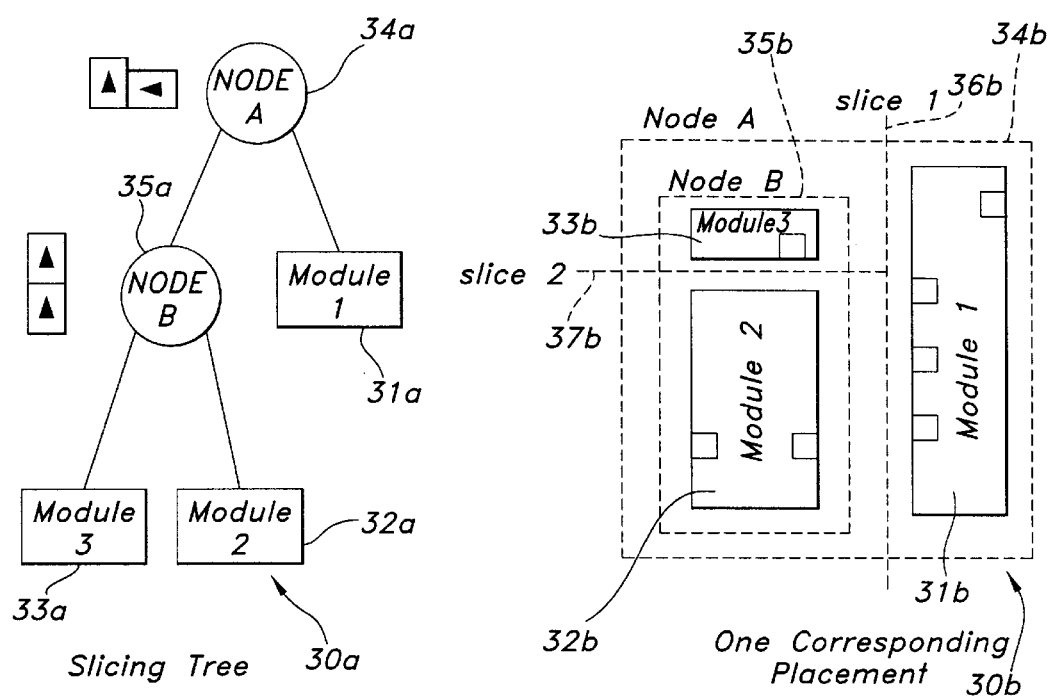
FIG. 3 shows an example of intermediate design results using the present method and one example final design result that could be derived from it.
Figure 4:
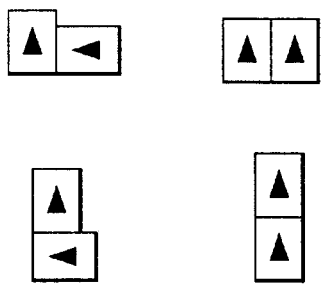
FIG. 4 illustrates the alternative adjacencies that can be chosen by an example design optimization program for an example design task using the present method.

FIG. 3 shows two possible configurations, or "adjacencies" that can be attained by reflecting or rotating the node as a whole. We break the placement into two stages. First we choose a structure called a "slicing tree" as illustrated in FIG. 3a. A slicing tree, 30a, is a binary tree as shown in FIG. 3a. Each leaf, elements 31a, 32a and 33a is a corresponding module 31b, 32b, 33b to be placed as shown in FIG. 3b. Each non-leaf node, 34a and 35a in FIG. 3a represents a dashed rectangular region 34b and 35b in FIG. 3b, containing all the modules that are its descendants, e.g. node 35a of FIG. 3a in the tree represents the inner dashed box 35b in the corresponding placement 30b as shown in FIG. 3b. In particular, a non-leaf node specifies that two rectangular regions represented by the node's two children will be placed next to each other in a specified relative configuration, e.g. node 34a in FIG. 3a represents one child rotated and placed above the other as shown by outer dashed box 34b in FIG. 3b. As FIG. 3 illustrates, a slicing tree 30a in FIG. 3a can be seen as recursively slicing the overall circuit are into rectangular regions, subregions, etc. Such slicing into rectangular regions is portrayed in FIG. 3b by slice1, 36b and slice 2, 37b. FIG. 4 merely shows the four possible configurations, or "adjacencies"—all other combinations of above/beside and rotated/non-rotated can be attained from these by reflecting or rotating the node as a whole.

Figure 5:
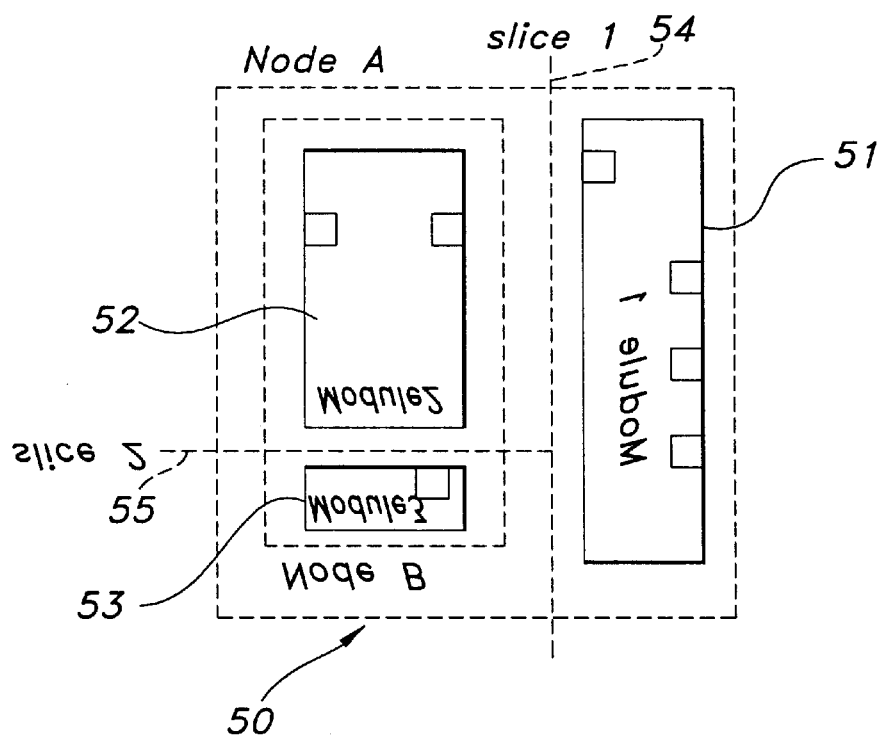
FIG. 5 shows another example design result that could be derived from the example intermediate design result in FIG. 3.

While a slicing tree specifies relative rotations of its parts, it does not specify reflections. Thus, if you have a concrete placement that corresponds to a given slicing tree, you can reflect any of the subregions, and get a different concrete placement that still corresponds to the same slicing tree. FIG. 5 shows another concrete placement that corresponds to the slicing tree in FIG. 3a. The another corresponding placement 50 illustrates the rotation of the modules 31b, 32b and 33b in FIG. 3b to the corresponding modules 51, 52 and 53 respectively. Furthermore, the slicing into rectangular regions are displayed as elements 54 and 55. Note that such reflections cannot change the bounding box area of the circuit, and hence cannot change the wasted area, but they can change the distances between ports, and thus changing the total wiring area.

We evaluate a slicing tree by a weighted sum of the wasted area and an estimate of the wire area. The wire area estimate is based on module sizes, and distances in the slicing tree.

We generate a slicing tree by first generating a binary tree with the specified modules as leaves, and then assigning the adjacencies in a bottom-up, greedy manner. We move from the leaves to the root, assigning at each node the adjacency that minimizes the area of the bounding box for this node, given the bounding boxes of the node's children.

The optimizer for slicing trees starts by generating a random binary tree. We define a set of neighbors as those trees that can be reached from the current tree by choosing two nodes and interchanging the subtrees rooted at those nodes, then revising the adjacencies. At each step of the optimizer, we generate the neighbors of the current tree in a random order until we find a neighbor that is better than the current tree. When we find a better one, we make that the current tree and repeat. If no neighbor is better, the optimizer halts.

The second stage of the placement process converts a slicing tree into a concrete, specific placement by choosing a set of reflections (two bits: reflect in x? reflect in y?) for each node in the slicing tree. This gives us enough constraints to determine a specific location and orientation in the plane for each rectangle, i.e., a concrete placement. Reflections are optimized in the same way that slicing trees are, with one set of reflections defined to be a neighbor of another if they differ in only one bit, i.e. can be reached from each other by changing one of the two reflections at one node of the slicing tree.

Expected Profit and Rational Best-First Search

In order to do RBF search, we need to be able to estimate the score of the final concrete placement we will get to, starting with some netlist or some slicing tree, and we also need to estimate the cost of getting that placement. In order to explain how we do this, we will discuss a sequence of increasingly complex situations, starting with an analysis of repeated stochastic search where we have only a single level problem and we know the relevant probability distributions. We then consider the case where the distributions are not known but must be inferred from data we get as we do the repeated optimizations, and then we extend our analysis to multiple levels.

Single-level, known distribution

We start by considering a single level problem, e.g., the problem of generating a concrete placement, given a slicing tree. Suppose we have a stochastic optimizer that, given a slicing tree, will generate a placement. If we run it multiple times on the same slicing tree, we will get different placements. Since each run is independent, we can view these placements as being randomly selected from some population. Note that this population is not the set of all placements, but rather the set of all places where the optimizer stops—in our case, the set of placements that cannot be improved by changing one reflection. Also note that different placements may have different probabilities of being selected.

Similarly, we can view the scores of the placements as being randomly selected from some distribution of scores. We can define the Child Score Distribution of a slicing tree, CSDtree (score), as the probability function for this distribution. I.e., if child(tree,placement) means that placement was generated from tree by our optimizer, then CSDtree(score)=P(score(placement)=score|child(tree, placement))

Suppose we know the CSD for some tree. What will be the average score of the placement we wind up with, after multiple runs? This depends, of course, on how many runs we do, so we first have to ask, what is the optimal number of runs?

We will assume we have some value function V(s), that tells us how much a placement with a given score s is worth to us in some units. We will assume that values are non-negative, and that a larger value is better. We assume, in keeping with our example problem, that lower scores are better and hence have higher value. That is, V is monotonic non-increasing. We will also assume that each run of the optimizer has some fixed cost, c, expressed in these same units. Then, if we have done n runs of the optimizer, resulting in scores $s_1$ to $s_n$, we can define our profit, i.e. utility, as $$\text{Profit} = \text{Value} - \text{Cost} = V(\min_{i=1 \text{ to } n}(s_i)) - n\,c$$

and ask how many runs we should do to maximize our expected profit.

The cost of an optimizer run is constant, but a run only improves the value if it finds a design with a better score than any found by previous runs, and the probability of finding such a design decreases as the best-so-far gets better and better. If sb is the score of the best design found so far, let us define the expected incremental value, EIV($s_b$), of one optimizer run to be the average amount by which one optimizer run will increase V($s_b$), as function of what $s_b$ is before the run. From the definition we can calculate the value of EIV:

$$EIV(s_b) = \sum_s CSD(s)\max(0, V(s) - V(s_b))$$

$$= \sum_{s < s_b} CSD(s)(V(s) - V(s_b))$$

$$= \left(\sum_{s < s_b} V(s)\right) - V(s_b)\sum_{s < s_b} CSD(s)$$

As $s_b$ gets better, EIV($S_b$) gets smaller. As long as EIV($s_b$)>c, the average payoff of doing a run is larger than the cost, and it pays to make another run. Eventually the EIV drops below c, at which point we should stop. In other words, if we define the threshold score $s_t$ to be such that EIV($s_t$)=c, then the optimal strategy is to continue generating children until we get one whose score is less than $s_t$.

The expected value of the final design is then the expected value of the first score we find under $s_t$, which is just the average of such scores, weighted by the relative probability of each score, i.e., the probability of getting that score is given that we got some score less than $s_t$:

$$EV = \sum_{s < s_t} V(s)CSD(s) \Big/ \sum_{s < s_t} CSD(s)$$

The chance of finding a score under $s_t$ in one run is $$\sum_{s < s_t} CSD(s)$$

so the average number of runs to find such a score is $$1 \Big/ \sum_{s < s_t} CSD(s)$$

and the expected cost, EC, is $$EC = c \Big/ \sum_{s < s_t} CSD(s).$$

So the Expected Profit, EP, will be $$EP = EV - EC$$

$$= \sum_{s<s_t} V(s)CSD(s) \Big/ \sum_{s<s_t} CSD(s) - c \Big/ \sum_{s<s_t} CSD(s)$$

A curious property to note is that $EIV(s_t)=c$ implies (by algebra on the formula above for EIV) that $$V(s_t) = \sum_{s<s_t} V(s)CSD(s) \Big/ \sum_{s<s_t} CSD(s) - c \Big/ \sum_{s<s_t} CSD(s) = EP$$

that is, the profit is just the value of the threshold score $s_t$. Since we stop for any score better than $s_t$ the average value of the score we stop at will be better than $V(s_t)$. But the average profit is the average stopping value minus the average cost of the runs, and subtracting the cost of the runs brings us exactly back to $V(s_t)$.

In summary, then, the value of a slicing tree (or, in general, any design object from which we can generate children with a stochastic optimizer) is $$EP_{tree}=V(s_t(CSD_{tree}))$$

where $s_t(CSD_{tree})$ is such that $$\left(\sum_{s<s_t} V(s)CSD(s)\right) - V(s_t)\sum_{s<s_t} CSD(s) = c$$

That is, the value of a slicing tree is determined by its CSD, and we can define $V^{CSD}(CSD)$ to be the value implied by a given CSD:

$$V^{CSD}(CSD)=V(s_t(CSD))$$

However, in general we do not know a priori what CSDtree is for any given tree. How we deal with this fact is the subject of the next section.

Single-level, adapting to the distribution

In general, we cannot assume we know the Child Score Distribution of a parent design object such as a slicing tree. Let us assume, however, that we know that the CSD's come from some parameterized family of distributions (e.g. the normal distributions, where mean and standard deviation are the parameters). Thus, each parent object has a vector of values R(parent) that are the parameters defining its CSD. We define $CSDR_R$ to be the distribution defined by parameter vector R. That is, $$CSD^{parent}(score)=CSDR_{R(parent)}(score)$$

For instance, if the family is the normal distributions, then CSDR<10,2> would be a normal distribution with mean=10 and standard deviation=2.

We further assume that, while we do not know the actual parameter vector R for any given parent object, we do have a heuristic score s(parent) for each parent, and that given this score we can compute a probability density function RD(R) giving the probability that the parent's parameter vector is R. That is, we know RDSs where $$RDS_s(R)=P(R(parent)=R|score(parent)=s)$$

For instance, if the family of distributions is the normal distributions then RD(<10,2>) would be the probability that we have a Child Score Distribution with mean=10 and standard deviation=2.

While assuming we know the CSDR (i.e., the family of distributions) and RDS may itself seem unrealistic, we will see below that in our example problem even a family that very roughly approximates the CSD's and a very approximate RDS give excellent results.

RDS gives us an initial estimate of a parent's RD based in its score, and once we have generated one or more children from a parent, we can use their scores to adjust this estimate via the Bayesian formula, $$P(R(parent) = R \mid child\ scores = s_1 \ldots s_n) =$$

$$\frac{P(R(parent) = R)P(child\ scores = s_1 \ldots s_n \mid R(parent) = R)}{P(child\ scores = s_1 \ldots s_n)}$$

i.e., $$RD(R) = \frac{RDS_{score(parent)}(R)\prod_{i=1}^{n} CSDR_R(s_i)}{\int_R \prod_{i=1}^{n} CSDR_R(s_i)dR}$$

Now, given our estimate of RD, let us consider how to make the control decisions. In order to calculate the EIV we need to know the CSD. We can calculate this from the RD:

$$CSD_{RD}(s)=\int_R RD(R)CSDR_R(s)dR$$

The analysis in the previous subsection based on CSD still holds for CSDRD, so we can calculate EIV and $s_t$ in the same way, the rational control strategy is unchanged, and the expected profit of design using this strategy is still $V(s_t)$.

So, we can determine the value of a design object from its RD:

$$V(RD)(RD)=V^{CSD}(CSD_{RD})$$

Thus the rational control strategy for repeated single-level stochastic design is to repeatedly generate a child and update our estimate of the parent's value based on the child scores so far, until $V(s_{t_b}) \geq V^{RD}(RD(parent))$, and the expected profit is $V^{RD}(parent)$. In other words, we continue generating children until we get a child whose value exceeds the value of the parent we are generating from.

Multiple levels

To apply our reasoning to a multi-level problem, let us assume we have heuristic score functions $s^{level}$ for each level. E.g., in our example problem, let us assume we have $s^{netlist}$, $s^{tree}$, and $s^{placement}$. Let us assume that we know the same things about the distributions of child scores as in the single level case; that is, assume that for each CSD we know family of functions it comes from, and thus the CSDR, and also that we know the RDS. Let us assume that for each optimizer we have some constant cost per run. Finally, let us assume that for the lowest level only, we know the value function V(score). In order to extend our control method to multiple levels, we need to be able to calculate the value of a design at any level, i.e., the expected profit from designing all the way to the bottom level if we start from that design. As is noted above, for the lowest level objects (e.g., placements) the function $V^{placement}$ (score) provides just this information. Furthermore, our analysis of the single level case shows us how to use this bottom-level value function to compute the threshold score $s_t^{placement}$ for the bottom level, and how to use $s_t^{placement}$ and $V^{placement}$ to compute the value function, $V^{tree}$ for the next level up. But now we can apply our single-level analysis to the second level, compute a threshold score $s_{tree}$ for generating slicing trees from netlists, and compute a value function $V^{netlist}$ for netlists.

Our single-level analysis tells us that if a netlist has a value $V^{netlist}$ then if we generate slicing trees from it until we get one with a value $v^{tree} > v^{netlist}$, then the expected value of $v^{tree}$ minus the expected cost of generating the slicing trees will be just $v^{netlist}$. If we now take the best slicing tree and generate placements from it until one has a value $v^{placement} > v^{tree}$, then $v^{netlist}$ minus the expected cost of generating placements will be $v^{tree}$. So, $v^{placement}$ minus the cost of generating both the placements and the trees will be $v^{netlist}$. In other words, the function $v^{netlist}(s)$ does indeed give the expected profit of taking the netlist and generating a placement, i.e. a final ground-level design, from it.

In general, if the ground level is level 0, the next level is 1, etc, $$V^i(s^i) = \int_R RDS_s^i(R) V^{i-1}(s_t^{i-1}(CSDR_R^i)) dR$$

were $s_t^{i-1}(CSDR_R^i) = s_t$ such that $$\left(\sum_{s < s_t} V^{i-1}(s) CSD^i(s)\right) - V^{i-1}(s_t) \sum_{s < s_t} CSD^i(s) = c^{i-1}$$

So we can compute $V^i(s)$ for any level i, and a design with a higher V is better than a design with a lower V, no matter what levels they are on.

One additional modification is needed for the multi-level case. In the single-level case, when we generate a child of some design object, we use the child's score to revise the parent's RD, and hence the parent's value. In the multi-level case, we must propagate this change further: changing the parent's value changes its parent's RD, and value. We propagate this change in value through all the ancestors of the new child.

The RBF search method can be summarized as best-first search using V to decide which design is better, as follows:

RBF search:
1. Initialize D, the set of design objects, to contain one object, representing the initial specifications.
2. Find the design object $d \in D$ with largest $V^{RD}(RD(d))$.
  If d is a ground-level design, stop and return d. Otherwise, run the appropriate optimizer to generate a child from d,
    use the score of this child to update the RD of d, the resulting change in d's value to update the RD of d's parent, etc.
    add the child to D and repeat step 2.

Empirical Test

The following represents a comparison of the Waterfall method to the inventive RBF method.

To test RBF we ran it and Waterfall on a set of 19 random netlists.

To save time, the tests were run on pre-generated data. For each netlist we generated 50 slicing trees, and for each of these trees we generated 100 placements. When we ran RBF or waterfall with this data, instead of calling the optimizer to generate a slicing tree we randomly chose one of the trees we had pre-generated for this tree netlist, and similarly for generating a placement from a tree.

We selected 4 different values of c, the cost per run of the optimizer: 12800, 6400, 3200, and 1600. We ran RBF at least 10 times on each netlist, and then ran Waterfall to compute (a) the number of probes Waterfall would need to achieve the same average score over the 19 modules as RBF did, and (b) the score Waterfall would achieve with the same number of optimizer runs valueas RBF used. The following table gives the results (higher score indicates worse design):

| c | RBF SCORE | RBF RUNS | WF SCORE SAME RUNS | WF RUNS SAME SCORE | RBF RUNS / WF RUNS SAME SCORE |
|---|---|---|---|---|---|
| 12800 | 108308.390 | 2.397 | 109897.280 | 4.000 | 0.599 |
| 6400 | 100026.900 | 5.100 | 103308.640 | 7.800 | 0.654 |
| 3200 | 95730.070 | 7.988 | 98666.180 | 13.400 | 0.596 |
| 1600 | 90353.690 | 18.626 | 95479.310 | 45.800 | 0.407 |

These results indicate that the present invention allows for a decrease of from 40%–60% in the number of optimizer runs needed to achieve a final design result of the same quality over the prior art Waterfall method.

The methods of the present invention can be used with various useful design optimization, design quality estimation and value computation programs and can be used to produce designs for any number and type of objects, including computer chips, airplanes, architectural structures, motor vehicles and the like.

What is claimed is:

1. A method for controlling a sequence of applications of design optimization programs, design quality estimation programs and value computation programs, in a computer system in order to improve a tradeoff between quality of a final design result and a computation time expended in said design optimization programs to get said final design result; each of said design optimization program being run in a sequence taking as input a result of a previous design optimization program;

a first design optimization program taking as input one or more specifications of an overall design task and a last design optimization program producing as output a complete design result for said overall design task; said method comprising the steps of:

(i) inputting said one or more specifications of said overall design task and initializing a set of design objects to include at least one of said one or more specifications;

(ii) computing an initial estimate of a utility of designing from said one or more specifications using said design optimization programs, said utility of designing being defined as an average value of a final result of a design process starting with said one or more specifications, minus an average cost in computer time of said design process; wherein each of said design optimization programs when run multiple times will produce different intermediate design results of varying quality as measured by said design quality estimation programs, and each of said design optimization programs having a known average cost in computer time per run; and said value computation program taking as data a design quality of an overall design result of said overall design task as measured by said design quality estimation programs, and producing as output a value to a user of said overall design result in comparable units to said known average costs of running said design optimization programs;

(iii) choosing as a current design object from a set of design objects, said current design object, being one of which said utility of designing is greatest; examining and recognizing if said current design object is a complete design result for said overall design task, and if so, producing an output of said current design object as said complete design result of said overall design task, and if not, proceeding to step (iv);

(iv) running an appropriate optimization program with said current design object as input to produce a new design object as a result, running said design quality estimation program on said new design object, estimating said utility of designing of said new design object, and adding said new design object to said set of design objects;

(v) revising an estimate of said utility of designing for said current design object based on the quality of said new design object, and revising said estimate of utility of designing of previous design objects from which said current design object was derived, based on a revised utility estimate of said current design object; and repeating from step (iii).

2. The method of claim 1 wherein said computation of utility of a new design object that is a complete design result for said overall design task is computed by running said value computation program on said new design object.

3. The method of claim 1 wherein said new design object is computed in accordance with a set of specified conditions and algorithms, said set of specified conditions and algorithms comprising:

computing a threshold score $s_t^n(s_p)$, for generating children objects at level n from a parent object at level n+1 whose score is $s_p$, to be such that $$\Sigma(V^n(s) - V^n(s_t^n(S_p)))CSDP^{n+1}(s_p, s_c) = c^n$$

whereby n is a level of said new design object, where levels are numbered so that when n=0 said complete design results are included for said overall design task, and said objects of design at level n are generated from objects of design at level n+1; whereby s is variable over possible scores of level n objects; whereby $CSDP^{n+1}(S_p,S_c)$ is an estimate of a probability that a design object generated from a design object at level n+1 will have score $S_c$, given that said object of design at level n+1 had score $S_p$; wherein $c^n$ is the cost of running said design optimization program that generates designs at level n, wherein $V^n(s)$ is said utility of design at level n whose score is s; and said utility of said new design object at level n+1 is computed according to the formula $V^{n+1}(s_p) = V^n(s_t^n(s_p))$.

4. The method of claim 1 further comprising a step of estimating said utility of design objects based upon initially estimating a probability distribution of scores of children of said design object from a score of said design object, and revising said estimate of probability distribution of scores of said children of said design objects based on scores of such children as are actually generated.

5. The method of claim 4 wherein said estimates of probability distribution of scores of said children of a design object are made according to the following formulas:

$$RD_{parent}^{n+1}(R) = \frac{RDS_{s_p}^{n+1}(R) \prod_{i=1...n} CSDR_R^{n+1}(s_i)}{\int RDS_{s_p}^{n+1}(R) \prod_{i=1...n} CSDR_R^{n+1}(s_i)dR}$$

wherein said child score distribution of various ones of said design objects at a given level are approximated by a parameterized family of distributions $CSDR_R(s)$; wherein R is a parameter or list of parameters characterizing a specific distribution from said family of distributions and $CSDR_R(s)=P$ is the specific distribution of child scores, given R; whereby $RDSs_p^{n+1}(R)$ wherein s=child score, wherein R is a given number;

wherein $RDSs_p^{n+1}(R)$ is a function giving an initial estimate of a probability that R is a correct value of said parameter characterizing said child score distribution of a level n+1 design object, based on said score $s_p$ of said level n+1 design object;

wherein scores $s_i$ where I=1 to n, are the scores of children which have actually been generated, and wherein $RD_{parent}^{n+1}(R)$ is a revised estimate of a probability that R is a correct value of said parameter characterizing said child score distribution of said parent design object at level n+1 based on both the score $s_p$ of said level n+1 design object and the scores $s_i$, and wherein $$CSD_{parent}^{n+1}(s) = \int_R RD_{parent}^{n+1}(R)CSDR_R^{n+1}(s_i)dR$$

wherein $CSD_{parent}^{n+1}(s)$ is a child score distribution of said level n+1 design object.

6. The method of claim 1 wherein said at least one or more specifications are selected from the group consisting of specifications for a machine, an article of manufacture and a composition of matter.

7. A computer generated design for a machine, an article of manufacture or a composition of matter, said computer generated design made by a process which controls a sequence of design optimization programs, design quality estimation programs and value computation programs, said process comprised of the steps of:

(i) inputting said one or more specifications of said overall design task and initializing a set of design objects to include at least one of said one or more specifications;

(ii) computing an initial estimate of a utility of designing from said one or more specifications using said design optimization programs, said utility of designing being defined as an average value of a final result of a design process starting with said one or more specifications, minus an average cost in computer time of said design process;

wherein each of said design optimization programs when run multiple times will produce different intermediate design results of varying quality as measured by said design quality estimation programs, and each of said design optimization programs having a known average cost in computer time per run, and said value computation program taking as data a design quality of an overall design result of said overall design task as measured by said design quality estimation programs, and producing as output a value to a user of said overall design result in comparable units to said known average costs of running said design optimization programs;

(iii) choosing as a current design object from a set of design objects, said current design object, being one of which said utility of designing is greatest; examining and recognizing if said current design object is a complete design result for said overall design task, and if so, producing an output of said current design object as said complete design result of said overall design task, and if not, proceeding to step (iv);

(iv) running an appropriate optimization program with said current design object as input to produce a new design object as a result, running said design quality estimation program on said new design object, estimating said utility of designing of said new design object, and adding said new design object to said set of design objects;

(v) revising an estimate of said utility of designing for said current design object based on the quality of said new design object, and revising said estimate of utility of designing of previous design objects from which said current design object was derived, based on a revised utility estimate of said current design object; and repeating from step (iii).

* * * * *

UNITED STATES PATENT AND TRADEMARK OFFICE
CERTIFICATE OF CORRECTION

PATENT NO.     : 6,367,052 B1
DATED          : April 2, 2002
INVENTOR(S)    : Steinberg et al.

It is certified that error appears in the above-identified patent and that said Letters Patent is hereby corrected as shown below:

<u>Column 4,</u>
Line 37, delete "...inputing said one..." and insert -- inputting said one --.

<u>Column 8,</u>
Line 42, delete "...that score is given..." and insert -- that score given --.

<u>Column 11,</u>
Line 21, delete "...were s...", and insert -- where s --.

Signed and Sealed this

Seventeenth Day of December, 2002

JAMES E. ROGAN
*Director of the United States Patent and Trademark Office*